United States Patent
Zhou et al.

(10) Patent No.: US 10,951,179 B2
(45) Date of Patent: Mar. 16, 2021

(54) IMPEDANCE CONTROL UNIT

(71) Applicant: Ampleon Netherlands B.V., Nijmegen (NL)

(72) Inventors: Lei Zhou, Nijmegen (NL); John Gajadharsing, Nijmegen (NL)

(73) Assignee: Ampleon Netherlands B.V., Nijmegen (NL)

( * ) Notice: Subject to any disclaimer, the term of this patent is extended or adjusted under 35 U.S.C. 154(b) by 54 days.

(21) Appl. No.: 16/568,896

(22) Filed: Sep. 12, 2019

(65) Prior Publication Data
US 2020/0083848 A1 Mar. 12, 2020

(30) Foreign Application Priority Data
Sep. 12, 2018 (NL) ...................... 2021613

(51) Int. Cl.
*H03F 3/68* (2006.01)
*H03F 1/56* (2006.01)
*H03F 1/02* (2006.01)
*H03F 3/195* (2006.01)
*H03F 3/21* (2006.01)

(52) U.S. Cl.
CPC ............ *H03F 1/56* (2013.01); *H03F 1/0288* (2013.01); *H03F 3/195* (2013.01); *H03F 3/211* (2013.01); *H03F 2200/294* (2013.01); *H03F 2200/372* (2013.01)

(58) Field of Classification Search
CPC .......... H03F 1/56; H03F 1/0288; H03F 3/195; H03F 2200/09; H03F 2200/387; H03F 2200/451; H03F 1/565; H03F 3/193; H03F 3/211; H03F 3/2176; H03F 3/2178; H03F 3/3001; H03F 3/602; H03F 3/604; H01P 5/028; H01P 5/10; H03H 11/32; H03H 11/28
USPC ............................................ 330/124 R, 295
See application file for complete search history.

(56) References Cited

U.S. PATENT DOCUMENTS

| 8,471,646 B2 * | 6/2013 | Essenwanger .......... H01P 5/028 333/26 |
| 8,564,367 B2 * | 10/2013 | Svechtarov ........... H03F 1/0288 330/124 R |
| 2016/0226509 A1 * | 8/2016 | Pagnanelli .......... H03M 1/0836 |
| 2016/0285420 A1 * | 9/2016 | Jones ...................... H01L 23/66 |

FOREIGN PATENT DOCUMENTS

| EP | 2843832 A1 | 3/2015 |
| JP | 6318792 B2 | 5/2018 |

OTHER PUBLICATIONS

NL International Search Report, NL Application No. 2021613, dated Jun. 20, 2019, 14 pages.
(Continued)

*Primary Examiner* — Khanh V Nguyen
(74) *Attorney, Agent, or Firm* — McDonnell Boehnen Hulbert & Berghoff LLP

(57) ABSTRACT

An impedance control unit is disclosed. Also disclosed are a balun unit, an electronic device, and a Doherty amplifier, each comprising the impedance control unit.
The impedance control unit comprises a pair of re-entrant type coupled lines, and further comprises an electrical short between the intermediate plane and the ground plane arranged locally inside the pair of coupled lines.

21 Claims, 11 Drawing Sheets

(56) References Cited

OTHER PUBLICATIONS

Shie, Ching-Ian et al., "A Miniaturized Microstrip Balun Constructed With Two γ/8 Coupled Lines and a Redundant Line", IEEE Microwave and Wireless Components Letters, vol. 20, No. 12, Dec. 2010, pp. 663-665.

\* cited by examiner

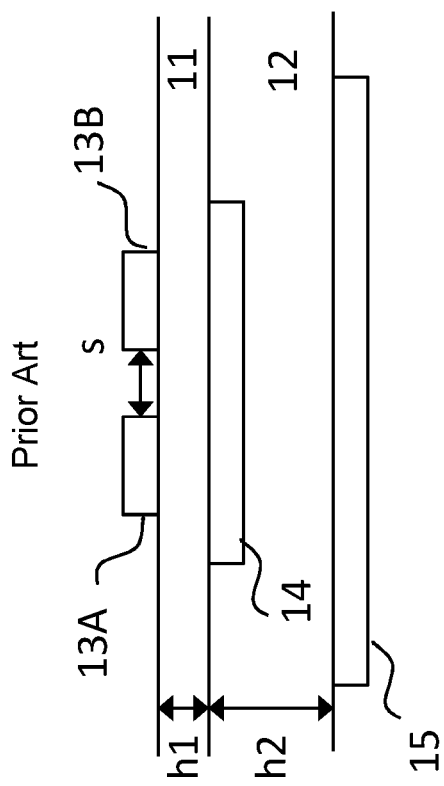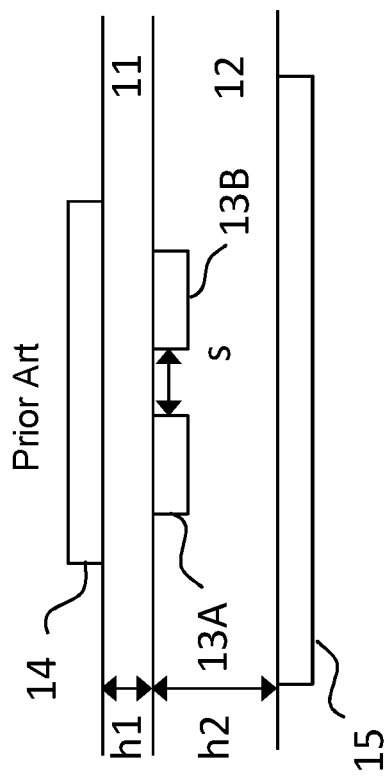

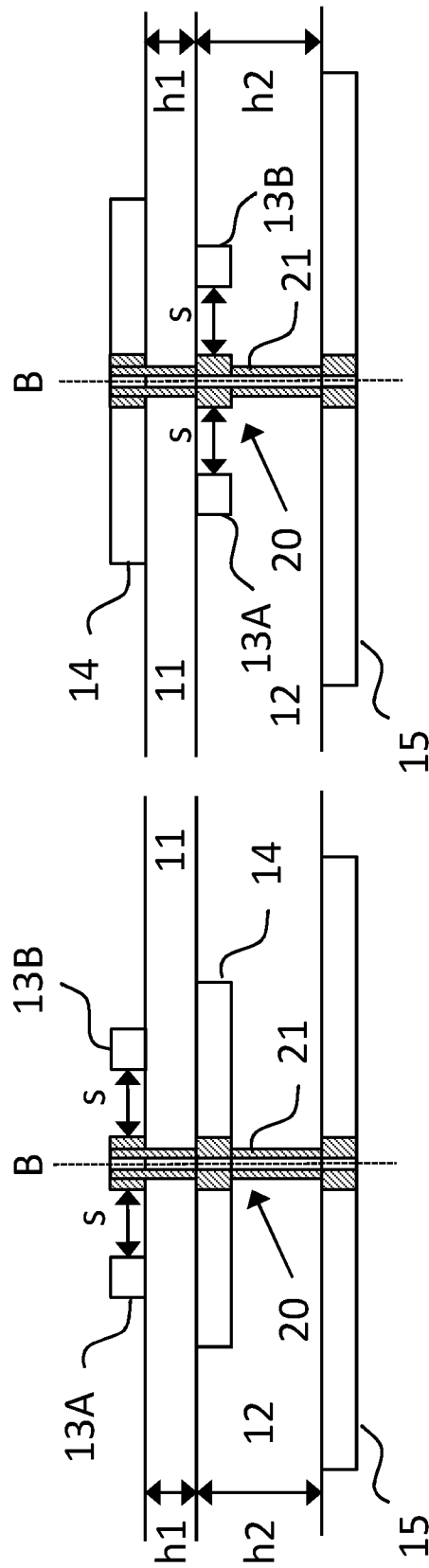

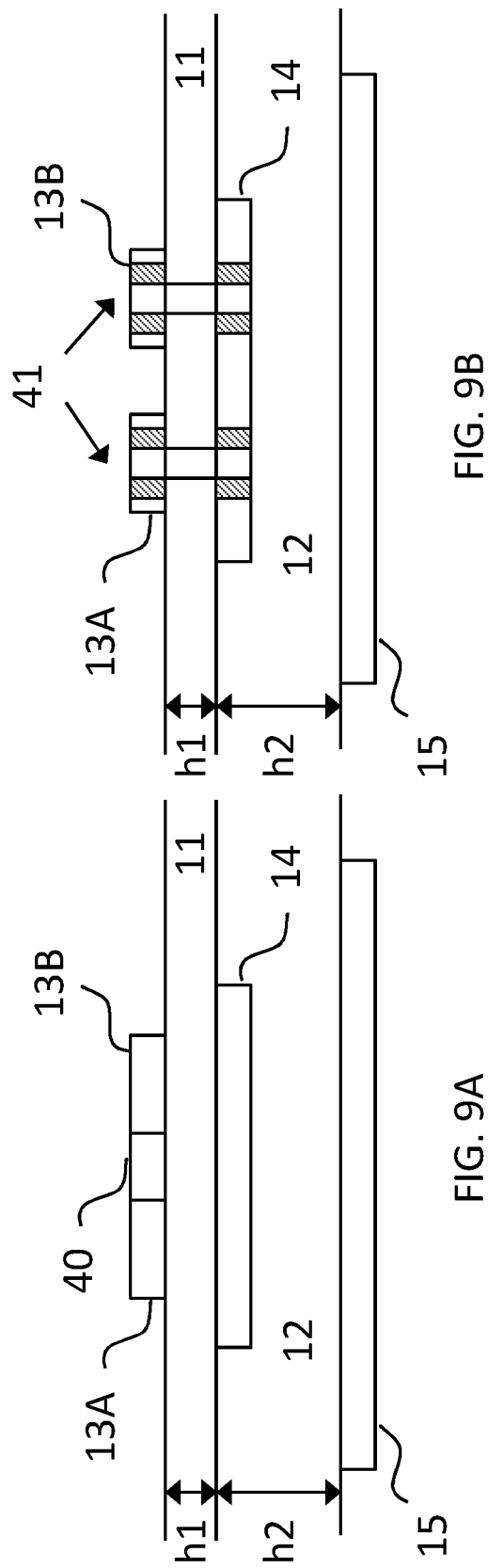

IMPEDANCE CONTROL UNIT

CROSS REFERENCE TO RELATED APPLICATIONS

The present application claims priority to Netherlands Patent Application NL2021613, which was filed in the Netherlands Patent Office on Sep. 12, 2018, and which is hereby incorporated in its entirety herein by reference.

FIELD OF INVENTION

The present invention relates to an impedance control unit. The present invention further relates to a balun unit, an electronic device, and a Doherty amplifier, each comprising the impedance control unit.

BACKGROUND

Push-pull amplifiers are well known in the art. These amplifiers comprise a pair of amplifying elements, such as transistors, wherein the input signal that is supplied to one amplifying element is phase shifted by 180 degrees relative to the input signal that is supplied to the other amplifying element. The outputs of the amplifying elements are fed to a balun, which converts the differential signal into a single-ended output signal.

In the radiofrequency (RF) domain, e.g. between 0.1 GHz and 100 GHz, the balun is often realized with transmission lines that are electromagnetically coupled. For example, the balun may use pairs of edged-coupled lines or broadside coupled lines.

An important performance parameter of a balun is the bandwidth with which it is able to provide the conversion between the differential and single-ended signals at acceptable losses. The bandwidth depends, inter alia, on the coupling coefficient that describes the electromagnetic coupling between the transmission lines. If this coefficient becomes larger, the bandwidth of the balun generally increases. The coupling coefficient can be made higher by arranging the strips of the transmission lines closer together. However, when arranging the balun on a printed circuit board or other type of laminated structure, the separation between the strips of the transmission lines is limited by the minimum allowable distance between metal structures on a given layer.

Coupled lines allow the propagation of even mode and odd mode signals. For an even mode signal, the line voltage for both lines is identical. For an odd mode signal, the line voltages for both lines show a 180 degrees phase difference. Generally, the phase velocities associated with the even mode and odd mode signals are different. This particularly holds for planar coupled lines. Moreover, the characteristic impedance for the odd mode signal is generally not equal to the characteristic impedance for the even mode signal.

In a typical push-pull amplifier comprising the pair of amplifying elements as described above, one amplifying element will output a signal Vo+Ve, whereas the other amplifying element will output a signal −Vo+Ve, wherein Vo is the odd mode component and Ve the even mode component. For most applications, only the odd mode component should be converted into the single-ended output signal by the balun and the even mode component should be rejected.

The amplifying elements of the push-pull amplifier can be operated in various classes. When operated in class A, a high quiescent current will flow and the input signal will not cause the amplifying element to enter into a non-conductive mode. In other classes, the transistor nonlinearities generate harmonic content at the output, due to the limited conduction angle which is typically controlled by the choice of the quiescent current. The efficiency for these classes is generally higher than that of class A provided that suitable impedance terminations are seen by the amplifying elements at the harmonic frequencies.

In reduced conduction angle PAs (e.g. assuming ideal classes AB, B, and C), all harmonics are shorted at the virtual drain reference plane. However, for switch-mode PAs, different requirements for harmonic terminations exist. In Class E, all harmonics are presented with an open circuit (or high impedance). In Class F or inverse Class F, a distinction (either short or open) should be made between odd and even mode impedances seen by the amplifying elements at the various frequencies.

It is known that by adding phase delay elements between the balun and the output of the amplifying elements, it is possible to manipulate the impedance seen by the amplifying elements at the various frequencies. Due to the difference in phase velocity, the effect of a delay element will be different for an odd mode signal than for an even mode signal.

EP 13182458.3 discloses a Doherty amplifier as illustrated in FIG. 1. Here, the Doherty amplifier comprises a pair of main amplifying elements Tm1, Tm2, and a pair of peak amplifying elements Tp1, Tp2.

Elements Tm1, Tm2 and elements Tp1, Tp2 are operated in a push-pull configuration. A splitter 1 splits an RF input signal towards main amplifying elements Tm1, Tm2 and peak amplifying elements Tp1, Tp2. Baluns 2, 3 create a differential signal that is fed to elements Tm1, Tm2, Tp1, Tp2. The outputs of Tm1, Tm2 and Tp1, Tp2 are connected to pairs 4, 5 of coupled lines. A further pair 6 of coupled lines is connected to pair 5 such that the phase delay between elements Tp1, Tp2 and power combining points P, P' equals 180 degrees, whereas the phase delay between elements Tm1, Tm2 and power combining points P, P' equals 90 degrees. In this manner, the impedance inversion required for Doherty operation can be achieved.

The differential signal present between power combining points P, P' is fed to a balun 7 via a pair 8 of coupled lines. Balun 7 converts the differential signal into a single-ended signal that can be supplied to a load 9. A phase compensating element 10 is used at the input to ensure that the signals from Tm1, Tm2 are in phase with the signals from Tp1, Tp2 at power combining points P, P'.

In this known Doherty amplifier, phase delay elements 4, 5, 6, and 8 are used for manipulating the odd mode and even mode impedances seen by Tm1, Tm2, Tp1, Tp2 at the higher harmonics.

A drawback of this known solution is that the impedances of the even mode and odd mode cannot be controlled individually in a straight forward manner. In other words, including a transmission line or other element to influence the even mode impedance at a higher harmonic frequency, such as the second harmonic frequency, will influence the odd mode impedance at the same and other frequencies. This complicates the design of the overall amplifier and may exclude a situation wherein the optimal odd mode impedance and optimal even mode impedance are provided to the amplifying elements simultaneously.

An impedance control unit as defined by the preamble of claim 1 is known from JP6318792B2. The known impedance control unit comprises a directional coupler that includes a coupling part composed of a main signal line conductor and a sub signal line conductor arranged in parallel to the main signal line conductor; a ground conductor which is arranged separated from the main signal conductor and the sub signal conductor; a flat ground conductor which is arranged in at least one region out of a first region between the coupling part and the ground conductor, a second region in the vicinity of its side part while mutually facing the main signal conductor, and a connection conductor which connects the flat ground conductor to the ground conductor. This directional coupler has an improved directivity. By providing the flat ground conductor connected to the ground conductor by the connection conductor, it is possible to increase the phase delay during even mode operation by a large amount as compared with the phase delay during odd mode operation. More in particular, the phase delays during even and odd mode operation can be equalized thereby allowing good directivity to be obtained.

SUMMARY

It is an object of the present invention to provide a solution wherein the odd mode impedances and even mode impedances can be individually controlled, or at least to a larger degree than known in the art.

According to the present invention, this object is achieved using an impedance control unit as defined in claim 1 which comprises a pair of re-entrant type coupled lines. These coupled lines comprise a first conductive strip and a second conductive strip spaced apart from the first strip, wherein the first and second strips are electromagnetically coupled. The coupled lines further comprise a conductive intermediate plane, and a conductive ground plane.

The impedance control unit according to the present invention is characterized in that it comprises an electrical connection between the intermediate plane and the ground plane arranged locally inside the pair of coupled lines.

Within the context of the present invention, when an element is said to be arranged locally inside the pair of coupled lines, this element is arranged inside the space that is occupied by the pair of coupled lines. Moreover, the local arrangement refers to a situation wherein the element is not arranged in a distributed manner along the signal propagation paths inside the pair of coupled lines. Preferably, a size of the locally arranged element along the signal propagation path does not exceed a length that exceeds an electrical length of 30 degrees at the frequency of interest.

The invention proposes to use a pair of re-entrant type coupled lines. Such lines are known from the prior art, e.g. "A miniaturized Microstrip Balun Constructed With Two lambda/8 coupled Lines and a Redundant Line", by Ching-Ian Shie et al, IEEE Microwave and Wireless Components Letters, Vol. 20, No. 12, 2010. These lines generally comprise a dielectric substrate comprising a first dielectric layer and a second dielectric layer, the first and second dielectric layers each having a first and second side, wherein the second side of the first dielectric layer is facing the first side of the second dielectric layer.

In a first embodiment of the re-entrant type coupled lines, shown in FIG. 2A, conductive ground plane 15 is arranged on the second side of second dielectric layer 12, and first strip 13A and second strip 13B are arranged on the first side of first dielectric layer 11. Intermediate plane 14 is arranged on the second side of first dielectric layer 11. Alternatively, intermediate plane 14 is arranged on the first side of second dielectric layer 12.

In a second embodiment of the re-entrant type coupled lines, shown in FIG. 2B, conductive ground plane 15 is arranged on the second side of second dielectric layer 12, and first strip 13A and second strip 13B are arranged on the second side of first dielectric layer 11, or alternatively, on the first side of second dielectric layer 12. Intermediate plane 14 is arranged on the first side of first dielectric layer 11.

Typically, height $h_1$ of first dielectric layer 11 is much smaller than height $h_2$ of second dielectric layer 12 and/or the dielectric constant of first dielectric layer 11 is much higher than the dielectric constant of second dielectric layer 12. Furthermore, it should be noted that FIGS. 2A and 2B are not true to scale. More in particular, the spacing s between conducting strips 13A, 13B is much larger than the height of the first dielectric layer 11, i.e. $s \gg h_1$. The electric field lines for odd mode signal propagation for the embodiments of FIGS. 2A and 2B are illustrated in FIGS. 3A and 3B, respectively. The electric field lines for even mode signal propagation for the embodiments of FIGS. 2A and 2B are illustrated in FIGS. 3C and 3D, respectively. As can be observed from FIGS. 3A and 3B, at a line A, a virtual ground can be identified in the case of odd mode signal propagation where the potential is zero. Such position cannot be identified in FIGS. 3C and 3D in the case of even mode signal propagation.

The Applicant realized that if the intermediate plane was actually grounded locally at position A, e.g. by making an electrical connection between the intermediate plane and the ground plane, the odd mode behavior of the coupled line would not or not severely be altered whereas the even mode behavior would. More in particular, by grounding the intermediate layer locally at position A, a local disturbance would be created for even mode propagation that resembles a capacitor between the strips and the grounded intermediate layer. As the dielectric constant of first layer 11 is relatively high and height $h_1$ is relatively low, the capacitance of such capacitor would be relatively high. At RF frequencies, such capacitor will act as an RF short or at least a relatively small impedance. The even mode impedance that can be observed at the ends of the coupled lines depends on the electrical length for even mode signals between the ends and the local electrical connection between the intermediate plane and the ground plane. As a result, it can be a large impedance, e.g. an open, or a small impedance, e.g. a short. In an embodiment, it may also be inductive to resonate out the output capacitance of the active devices. On the other hand, the impedance for the odd mode will not or hardly be affected by the local electrical connection of the intermediate plane. By using the impedance control unit of the present invention it therefore becomes possible to control the even mode behavior without substantially changing the odd mode behavior. Furthermore, such structure can be manufactured relatively easy when using a pair of re-entrant type of coupled lines.

The length and width of each line of the pair of coupled lines is preferably identical. More in particular, the length and width of the first and second strips is preferably identical and the same as the length and width of the corresponding coupled line, respectively. Moreover, the cross section of the first and second strips, the intermediate plane and ground plane, is preferably uniform along the length of the coupled lines.

The electrical connection may be positioned at $(2n-1)$ times a quarter wavelength as computed from an end of the first strip and/or second strip, said quarter wavelength being based on an even mode phase velocity at a first predefined frequency, and n being a positive integer, e.g. an integer larger than 0 such as 1, 2, etc. When the electrical connection is a short, the even mode impedance seen at this end of the first strip and/or second strip looking into the pair of coupled lines will be very large due to the impedance inversion from a small impedance to a large impedance caused by the quarter wavelength. The skilled person will readily understand that the actual even mode impedance seen looking into the pair of lines will differ from an ideal RF open but will constitute an impedance that may be approximated by an ideal RF open.

The present invention is not limited to the abovementioned positioning of the electrical connection. Any position of the electrical connection will introduce a discrepancy between the odd and even mode behavior that can be utilized to achieve desired odd and even mode impedances at a desired frequency.

In case a high even mode impedance is desired at the second harmonic frequency, the first predefined frequency may correspond to this second harmonic frequency.

The impedance control unit may comprise a first input port at a first end of the first strip, a first output port at a second end of the first strip, a second input port at a first end of the second strip, and a second output port at a second end of the second strip, wherein the quarter wavelength is computed from the first end of the first strip and/or the first end of the second strip.

A length of the first and second strips may substantially equal (2p−1) times a quarter wavelength or 2p times a quarter wavelength, wherein the quarter wavelength is based on an odd mode propagation velocity at a second predefined frequency, and p being an integer larger than zero. When the length of the first and second lines equals 2p−1 times a quarter wavelength, the coupled lines will act as an impedance inverter for odd mode signals. When the length of the first and second lines equals 2p times a quarter wavelength, the coupled lines will act as a phase delay element for odd mode signals essentially without impedance transformation. At the same time, due to the electrical connection, the behavior for even mode signals will be different.

The first and/or second predefined frequency may lie within a range from 0.1 GHz-100 GHz.

The coupled lines typically display a cross-section that is constant along the length of the coupled lines with the exception of bends and the electrical connection(s) between the intermediate plane and the ground plane. The first and second strips are typically arranged spaced apart from each other in a parallel manner wherein the gap between the lines is constant. The electrical connection may be laterally positioned at a center of this gap. More in particular, a center point of the electrical connection may coincide with the center of the gap.

The electrical connection may comprise a conductive via that extends through the second dielectric layer. A via is typically fabricated by etching or otherwise providing a hole through a dielectric layer and providing metallization on the walls of this hole. In some cases, the realization of a via that extends only between an intermediate layer situated between the first and second dielectric layers and the ground plane may be difficult to realize. In such cases, it may equally be possible that the electrical connection comprises a conductive through via that extends through both the first and second dielectric layers. To avoid electrical contact between the first and second strips and this via, which would undesirably alter the odd mode behavior, the first and second strips may be configured such that they curve around the via.

In an embodiment, the intermediate plane is arranged in between the first and second dielectric layers and the first and second strips are arranged on the first side of the first dielectric layer. In another embodiment, the first and second strips are arranged in between the first and second dielectric layers and the intermediate plane is arranged on the first side of the first dielectric layer. In this latter embodiment, a through via is preferably used for realizing the electrical connection.

To maximize the coupling between the first and second strips and to thereby improve the bandwidth of the impedance control unit it is preferred if a dielectric constant of the first dielectric layer is substantially larger than a dielectric constant of the second dielectric layer and/or if a thickness of the first dielectric layer is substantially smaller than a thickness of the second dielectric layer.

In general, the intermediate plane laterally extends beyond the first and second strips and the ground plane laterally extends beyond the intermediate plane. It is preferred if the coupled lines, preferably including the electrical short, are symmetric relative to a plane that extends perpendicular to dielectric substrate, parallel to the first and second strips, and through the abovementioned center of the gap between the first and second strips. Such symmetry will improve even mode behavior.

The impedance control unit may further comprise an electrical connection between the first and second strips that is arranged locally inside the pair of coupled lines and is positioned at (2m−1) times a quarter wavelength as computed from an end of the first strip and/or second strip, wherein the quarter wavelength is based on an odd mode propagation velocity at a third predefined frequency, and m being a positive integer. Such electrical connection will not or hardly affect even mode behavior as the even mode behavior is largely determined by the height and dielectric constant of the second dielectric layer. It therefore becomes possible to, within a single structure, influence both odd-mode and even-mode behavior.

It should be noted that an electrical connection between the first and second strips may be applied even without the application of an electrical connection between the intermediate layer and the ground plane. Such embodiment would allow the control of the odd-mode behavior without essentially changing the even-mode behavior.

The electrical connection between the first and second strips may comprise a conductive line that extends between the first and second strips. Alternatively, the electrical connection may comprise a first conductive via that extends between the first strip and the intermediate plane and a second conductive via that extends between the second strip and the intermediate plane.

According to a second aspect, the present invention provides a balun unit that comprises a balun having a first balanced port, a second balanced port, and an unbalanced port. The balun unit according to the invention further comprises the impedance control unit as described above, wherein the first strip is connected to the first balanced port and wherein the second strip is connected to the second balanced port.

The balun and the impedance control unit may be arranged on a same substrate. More in particular, the balun may comprise a plurality of the aforementioned re-entrant type coupled lines. Furthermore, the ground planes of the plurality of re-entrant coupled lines and the ground plane of the impedance control unit may be formed by a single ground plane.

The balun may comprise a Marchand balun that can be physically realized using edge-coupled lines, broadside coupled lines or re-entrant type coupled lines. The planar version of the Marchand balun is most widely used in microwave/RF systems because it is easy to implement and provides wide bandwidth. Re-entrant type coupled lines are preferred because they allow a planar printed circuit board implementation. They further offer the advantage that, unlike for broadside coupled lines, cavities are not required. In addition, unlike for edge coupled lines, very narrow gaps between the strips can be avoided. Using re-entrant coupled lines, which have a large even-mode and small odd-mode impedance, contributes to a wide band and balanced balun performance. Conventionally, a Marchand balun consists of two λ/4 coupled lines. When a Marchand balun is used, it is preferred if this balun comprises a compensation line for compensating a difference in propagation velocities for an even mode and an odd mode.

According to a third aspect, the present invention provides an electrical device comprising the impedance control unit and/or the balun unit as described above.

The electrical device may be configured to operate at an operational frequency, wherein the first predefined frequency may correspond to 2i times the operational frequency, with i being an integer larger than zero. This allows the even-mode impedance at the higher harmonic frequencies to be controlled. Additionally, the third predefined frequency may correspond to 1+2j times the operational frequency, with j being an integer larger than zero. This allows the odd-mode impedance at the higher harmonic frequencies to be controlled.

The electrical device may comprise a pair of amplifying elements that are operated in a push-pull configuration and the abovementioned balun unit or the abovementioned impedance control unit, wherein an output of a first amplifying element is coupled to the first strip of the impedance control unit and wherein an output of a second amplifying element is coupled to the second strip of the impedance control unit.

According to a fourth aspect, the present invention provides a Doherty amplifier that comprises a pair of main amplifying elements that are operated in a push-pull configuration, and a pair of peak amplifying elements that are operated in a push-pull configuration. The Doherty amplifier further comprises a splitter for splitting an RF input signal and for feeding the split RF input signal to the pairs of main and peak amplifying elements, and a Doherty combiner configured for combining signals from a first main amplifying element and a first peak amplifying element, and for combining signals from a second main amplifying element and a second peak amplifying element. A balun is provided that has a first balanced input port configured for receiving the combined signals from the first main amplifying element and the first peak amplifying element, a second balanced input port configured for receiving the combined signals from the second main amplifying element and the second peak amplifying element, and an output port.

According to the present invention, the Doherty amplifier is characterized in that the Doherty combiner comprises the impedance control unit as defined above.

The abovementioned electrical device or Doherty amplifier may be configured such that the pair(s) of amplifying elements is/are configured to operate in class E or inverse class F.

BRIEF DESCRIPTION OF THE DRAWINGS

Next, the invention will be described in more detail referring to the figures, wherein:

FIGS. 2A and 2B schematically illustrate two known embodiments for two known different pairs of re-entrant type of coupled lines;

FIGS. 5A and 5B illustrate cross sectional views of embodiments of an impedance control unit in accordance with the present invention that correspond to the coupled lines in FIGS. 2A and 2B, respectively, wherein an electrical connection is provided between the intermediate plane and the ground plane;

FIGS. 9A and 9B illustrate cross sectional views of further embodiments of an impedance control unit in accordance with the present invention that correspond to the coupled lines in FIGS. 2A and 2B, respectively, wherein an electrical short is provided between the strips.

DETAILED DESCRIPTION

Figure 4B:
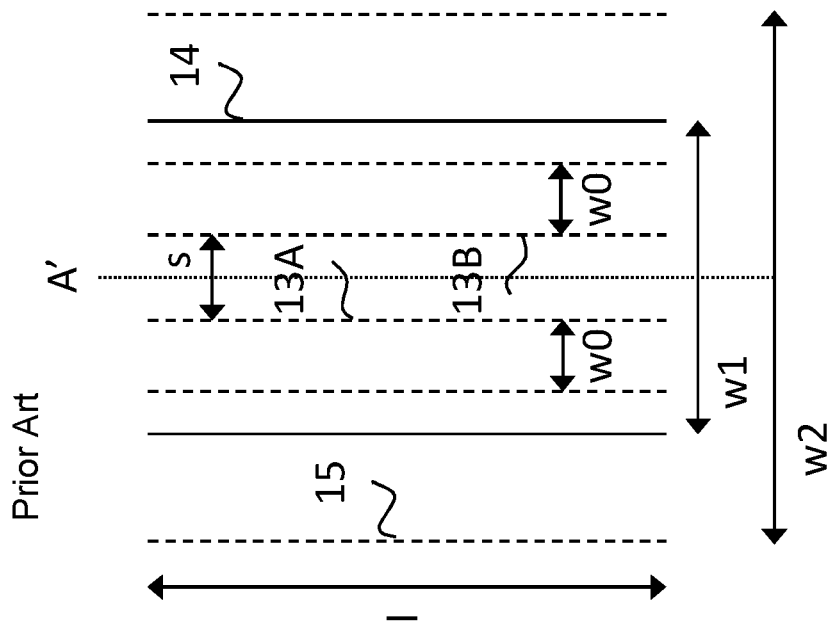
FIGS. 4A and 4B illustrate top views of the coupled lines of FIGS. 2A and 2B, respectively.
Figure 4A:
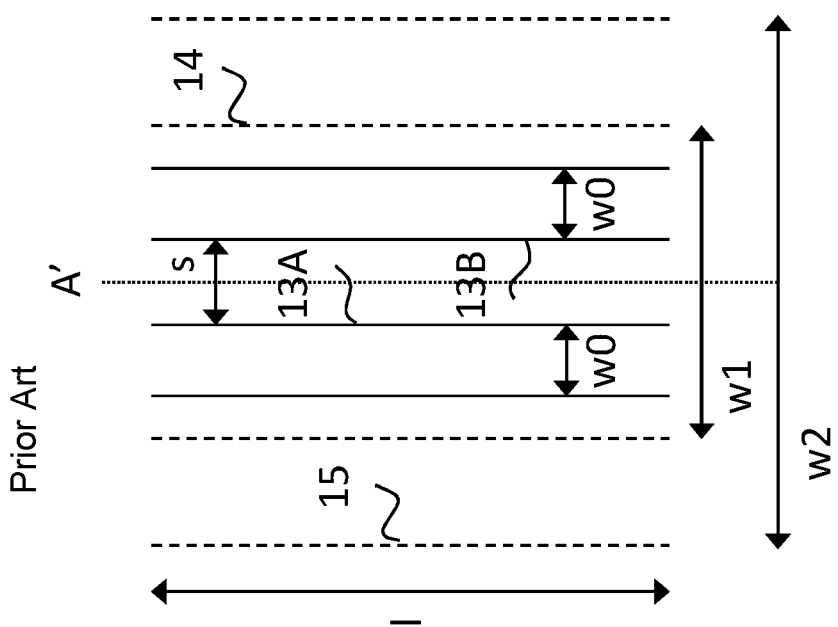

FIGS. 4A and 4B illustrate top views of the coupled lines of FIGS. 2A and 2B, respectively. Here, strips 13A, 13B each have a width w0 and are separated by a distance s, wherein s>>h1. Ground plane 15, intermediate plane 14, and strips 13A, 13B all extend over a length 1. Intermediate plane 14 laterally extends beyond strips 13A, 13B. In other words, width w1 of intermediate plane 14 is larger than 2w0+s. Ground plane 15 extends laterally beyond intermediate plane 14. More in particular, width w2 of ground plane 15 is larger than w1. Strips 13A, 13B, intermediate plane 14 and ground plane 15 are symmetrically arranged relative to symmetry line A', which extends along the length of the coupled lines.

Figure 6A:
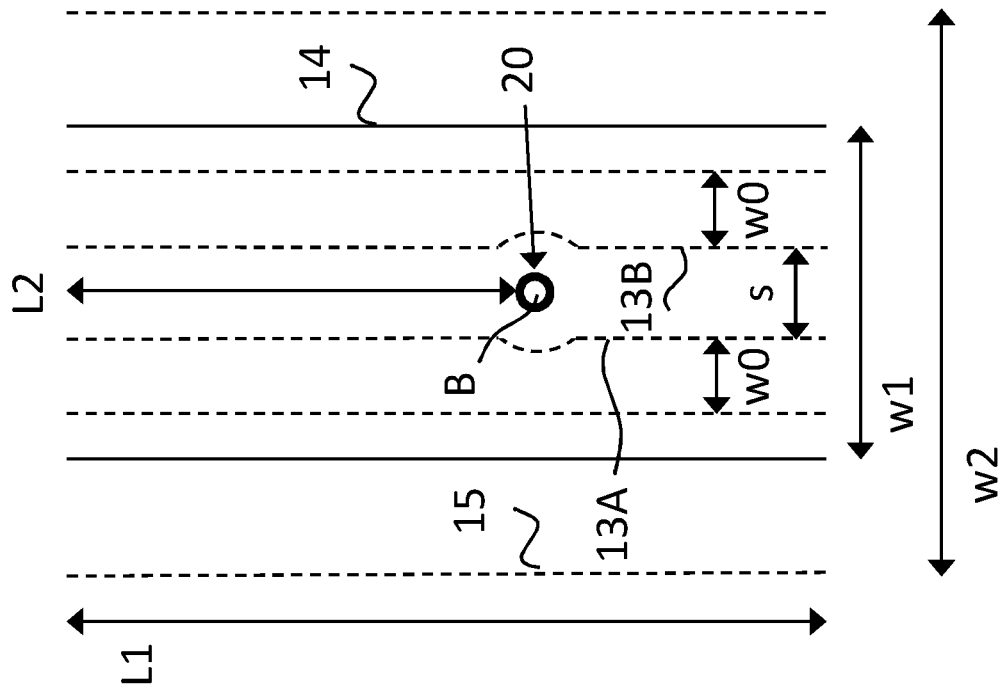
FIGS. 6A and 6B illustrate top views of the embodiments of the impedance control unit shown in FIGS. 5A and 5B, respectively.
Figure 6B:
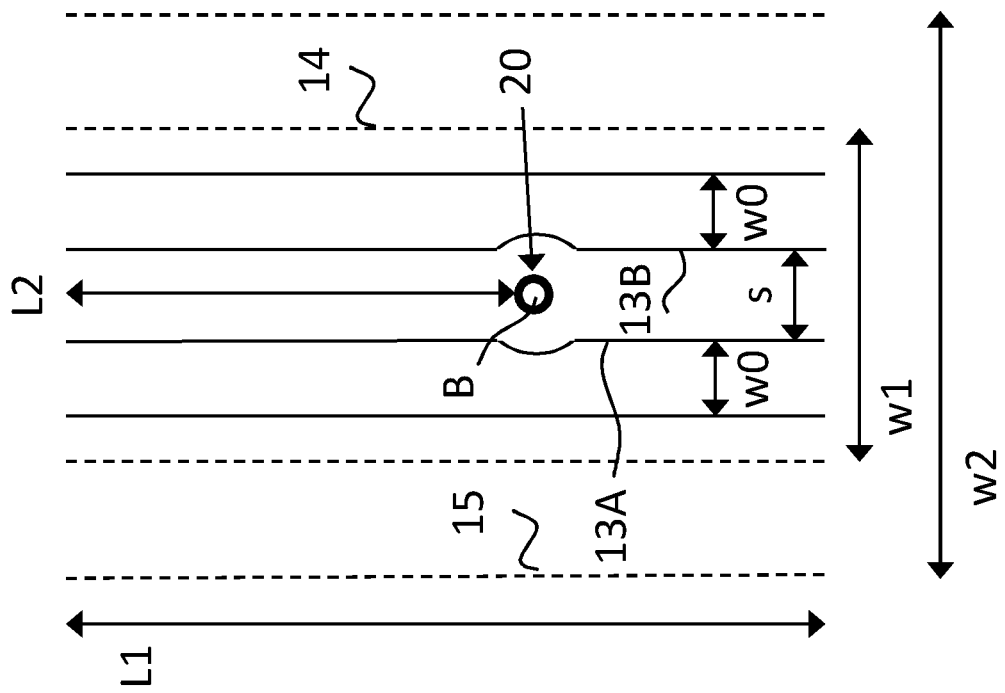

FIGS. 5A and 5B illustrate cross sectional views of embodiments of an impedance control unit in accordance with the present invention that correspond to the coupled lines in FIGS. 2A and 2B, respectively, wherein an electrical connection is provided between the intermediate plane and the ground plane. FIGS. 6A and 6B illustrate top views of the embodiments of the impedance control unit shown in FIGS. 5A and 5B, respectively.

Compared to the coupled lines shown in FIGS. 2A and 2B, the impedance control unit according to the invention comprises a local short at position B between intermediate plane 14 and ground plane 15. This short is realized using a through via 20 that extends from a top side of first dielectric layer 11 to a bottom side of second dielectric layer 12. On the inside of the walls of via 20, conductive material 21, such as metal or a combination of metals, is arranged. On the bottom side, conductive material 21 contacts ground plane 15. Similarly, between first and second dielectric layers 11, 12, conductive material 21 contacts intermediate plane 14. At the top side, the separation between conductive material 21 and first and second strips 13A, 13B is typically equal to s, wherein s is the minimal allowable separation between strips 13A, 13B. Furthermore, from FIGS. 6A and 6B, it can be observed that strips 13A, 13B curve around via 20. Moreover, it is clear from these figures that via 20 constitutes a local connection only.

The length between one end of strips 13A, 13B and position B may correspond to a quarter wavelength for even mode signal propagation at a given frequency. For example, the impedance control unit may be configured to control the even mode impedance at the second harmonic frequency 2f0, whereas it should operate as an impedance inverter for odd mode signal propagation at the fundamental frequency f0. To this end, the length of the entire impedance control unit, i.e. L1, may correspond to a quarter wavelength at f0 for odd mode signal propagation, whereas a length L2 between one end of strips 13A, 13B and a center point B of through via 20 may correspond to a quarter wavelength at 2f0 for even mode signal propagation. As stated before, the phase velocities for odd mode and even mode signal propagation typically deviate substantially from each other. When configured as stated above, the impedance control unit may be connected in between amplifying elements and balun as shown in FIG. 7.

Again it should be noted that the present invention is not limited to the lengths described above. Instead different electrical lengths for different frequencies may be chosen depending on the odd and even mode impedances that are required.

Figure 7A:
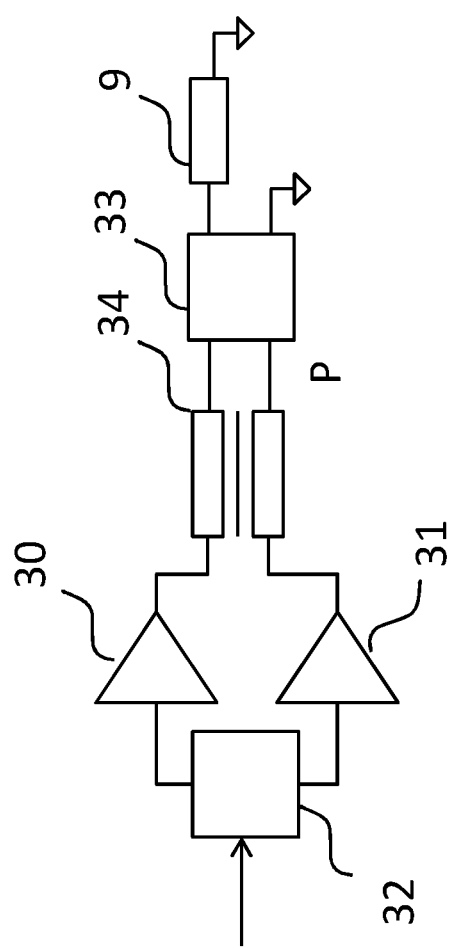
FIGS. 7A and 7B illustrate an embodiment of a push-pull amplifier and the corresponding balun unit, respectively, in accordance with the present invention.

FIG. 7A illustrates an embodiment of a push-pull amplifier in accordance with the present invention. This amplifier comprises a pair amplifying elements 30, 31, that for instance are realized using Si LDMOS transistors or GaN field-effect transistors. These elements are fed using a splitter 32 that splits an RF input signal into a part directed towards element 30 and a part directed towards element 31, wherein the part directed to element 31 shows a 180 degrees phase offset relative to the part directed to element 30.

The push-pull amplifier further comprises a balun 33 and an impedance control unit 34 as illustrated in FIG. 6A. The combination of impedance control unit 34 and balun 33 is referred to as balun unit and is described in more detail in reference to FIG. 7B.

Figure 7B:
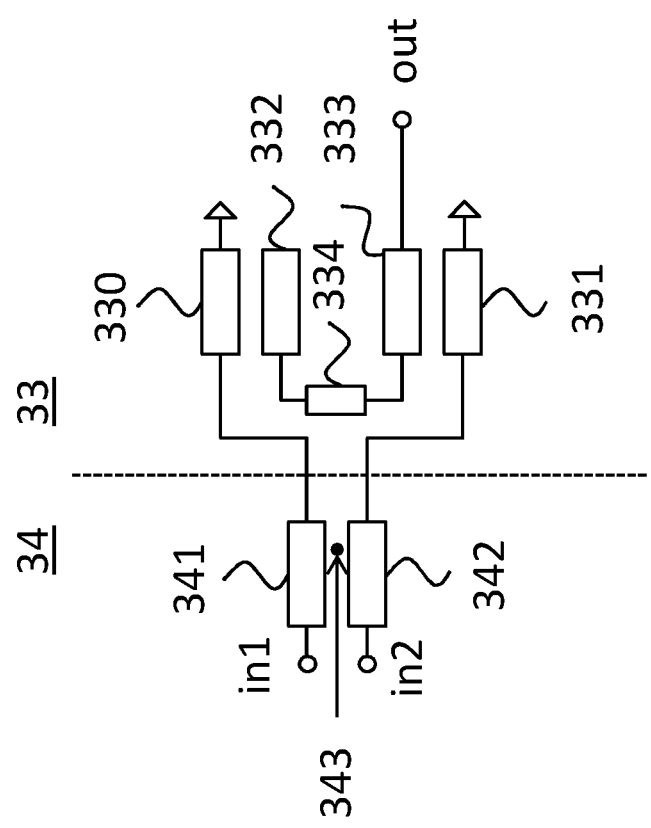

In FIG. 7B, the balun comprises a Marchand balun although other baluns could also have been used. The Marchand balun comprises a first quarter wavelength transmission line 330 of which one end is grounded. This transmission line is electromagnetically coupled to a second quarter wavelength transmission line 332 of which one end is left open and of which another end is connected to a third quarter wavelength transmission line 333 via a compensation element 334. The other end of third quarter wavelength transmission line 333 is connected to the output of the balun. In addition, line 333 is electromagnetically coupled to a fourth quarter wavelength transmission line 331 of which one end is grounded. Preferably, the Marchand balun is realized using re-entrant type coupled lines.

Impedance control unit 34 comprises a pair of coupled lines 341, 342 as illustrated in FIG. 6A. The strip of line 341 is connected to one end of the first quarter wavelength transmission line 330 whereas the strip of line 342 is connected to one end of the fourth quarter wavelength transmission line 331.

In the above, when a line corresponding to a pair of coupled lines is said to have a length of a quarter wavelength, then the length of that line corresponds to a quarter wavelength when computed using the phase velocity of odd mode signals at the operational frequency.

It should be noted that impedance matching networks may be provided in between amplifying elements 30, 31 and impedance control unit 34.

Using impedance control unit 34 of the present invention, suitable odd and even mode impedances can be realized at the desired frequencies. For example, impedance control unit 34 may be configured to present a very high even mode impedance at the second harmonic frequency.

Using the impedance control unit of the present invention, the odd mode impedance at the fundamental frequency, e.g. 1 GHz, can be set substantially independently from the even mode impedance at the second harmonic frequency, e.g. 2 GHz. Proper control of the harmonic frequencies is particularly important for certain types of amplifier operation classes, e.g. class E or inverse class F, wherein during a substantial part of the signal period amplifying elements 30, 31 are brought into a non-conductive state, e.g. pinch-off.

Figure 1:
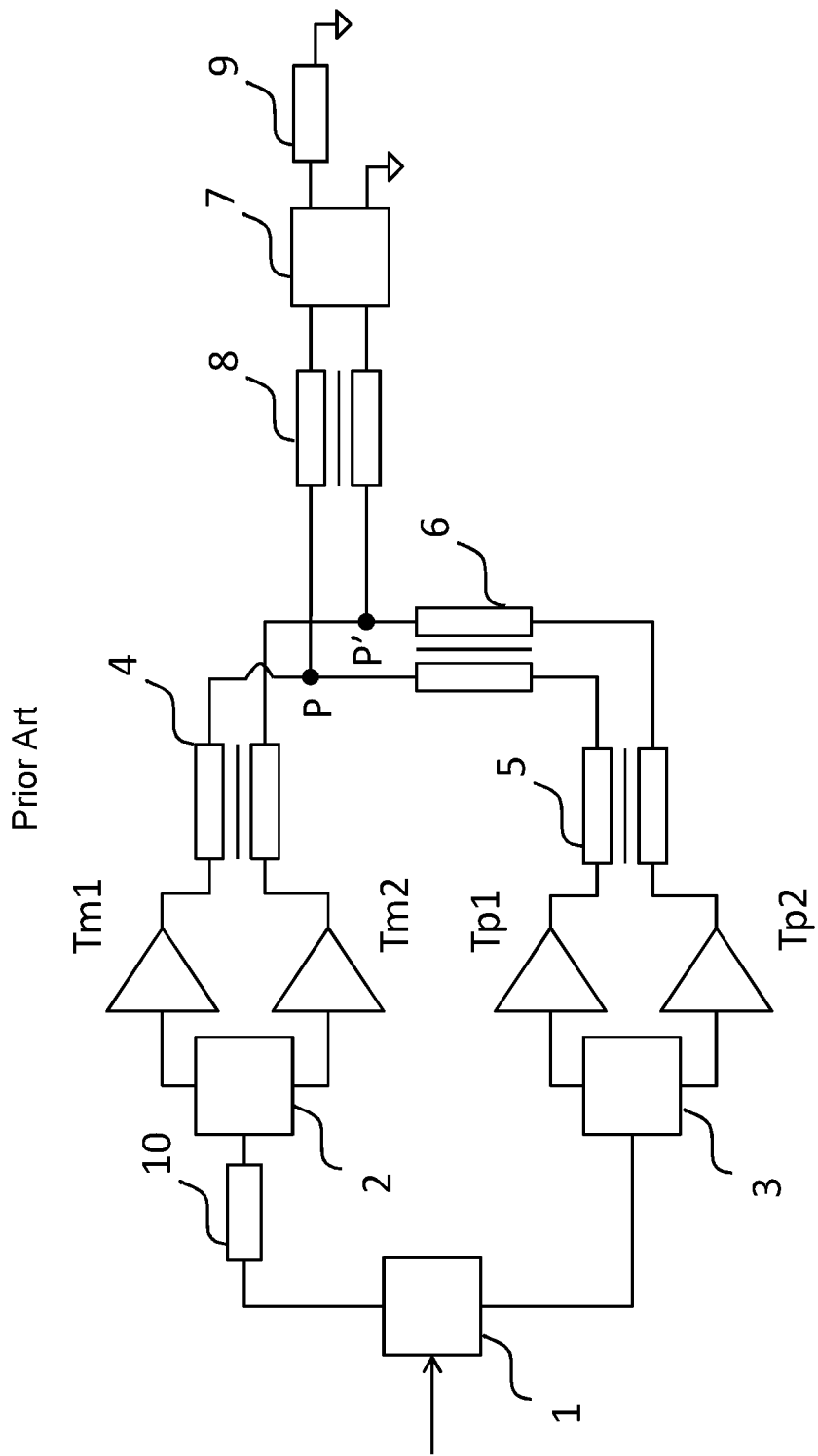
FIG. 1 illustrates a known Doherty amplifier that is based on differential operation.
Figure 3A:
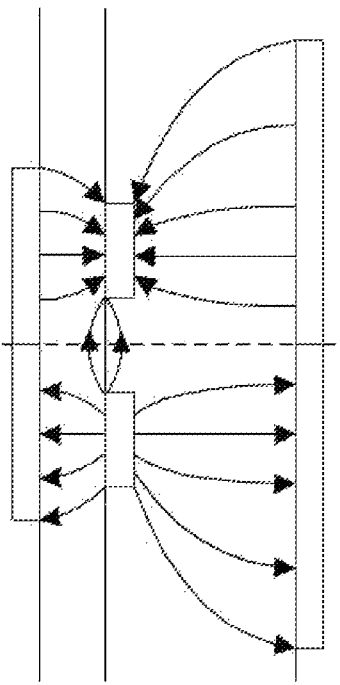
FIGS. 3A and 3B schematically illustrate some of the electric field lines for odd mode signals for the re-entrant type of coupled lines shown in FIGS. 2A and 2B, respectively, and FIGS. 3C and 3D schematically illustrate some of the electric field lines for even mode signals for the re-entrant type of coupled lines shown in FIGS. 2A and 2B, respectively.
Figure 3B:
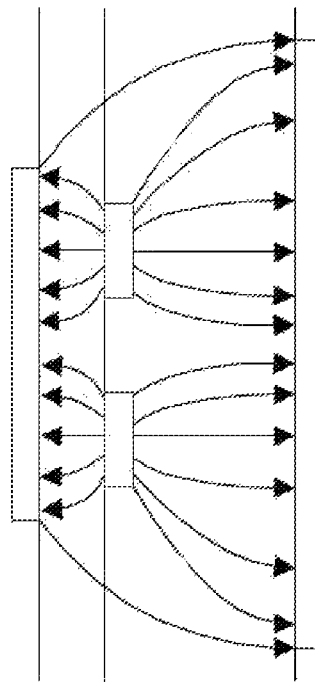
Figure 3C:
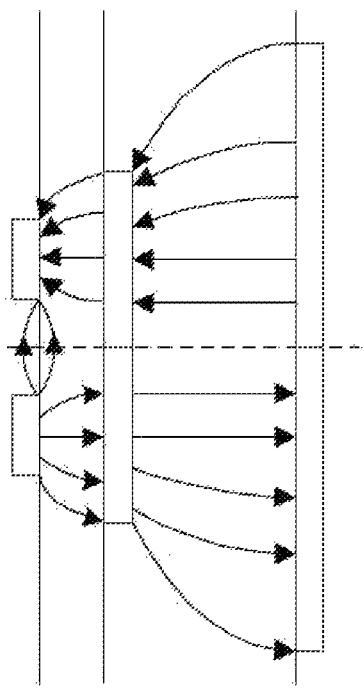
Figure 3D:
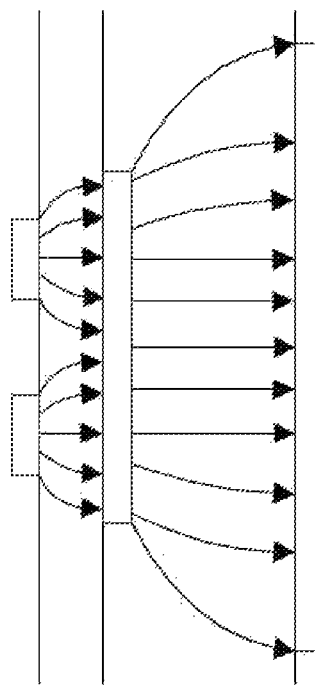
Figure 8:
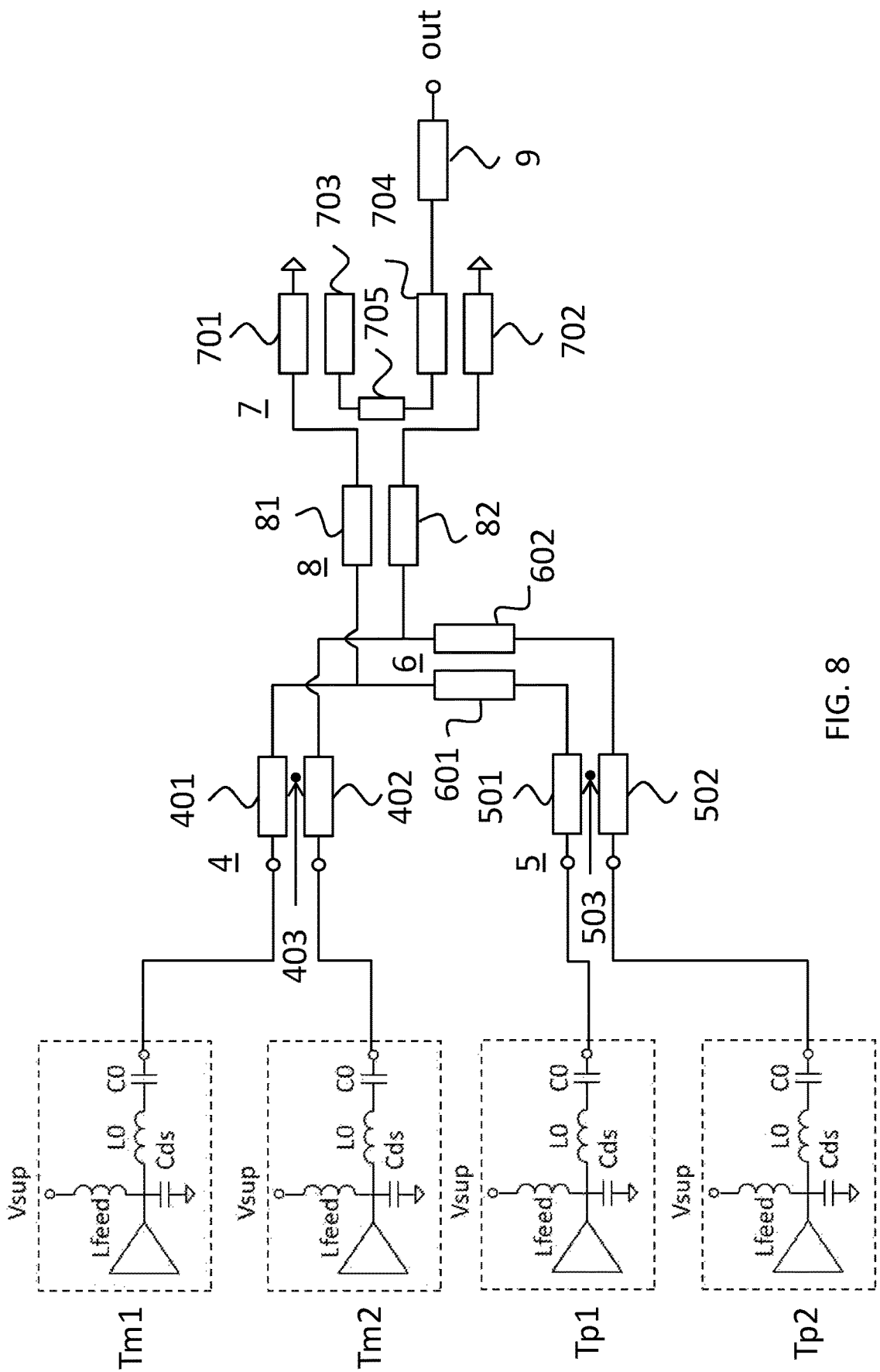
FIG. 8 illustrates the Doherty amplifier of FIG. 1 that has been modified in accordance with the present invention.

A similar application of the impedance control unit can be used in the Doherty amplifier in FIG. 1. For example, the Doherty combiner, formed by pairs 4, 5, and 6, may, at least partially, be realized using the impedance control unit of the present invention. For example, pairs 4 and/or 5 can be realized using the impedance control unit of FIG. 6. This application of the impedance control unit of the present invention is shown in FIG. 8.

Each of the amplifying elements Tm1, Tm2, Tp1, Tp2 is presented with a class E load formed by the feed line inductor Lfeed, which connects the amplifying element to a supply voltage, output capacitance Cds of the amplifying element, resonant inductor L0 that may be formed using one or more bondwires, and DC block capacitor C0, wherein the latter two components are configured to resonate at the fundamental frequency.

For proper class E operation, each of the amplifying elements needs to see high impedances at the higher harmonics. However, because the third and higher harmonics are of relatively small amplitude, correct impedances are mostly important at the fundamental and second harmonic frequency.

The high impedances at the second harmonic frequency are realized using the impedance control unit of the present invention. More in particular, in FIG. 8, pairs 4, 5 of coupled lines in FIG. 1 have been replaced with impedance control units of the present invention. For example, pair 4 in FIG. 1 is replaced by a pair of coupled lines 401, 402 in correspondence with FIG. 6A. Here, arrow 403 marks the location of the through via that connects the intermediate plane to the ground plane. Similarly, pair 5 is replaced by a pair of coupled lines 501, 502 in correspondence with FIG. 6A. Arrow 503 marks the location of the through via that connects the intermediate plane to the ground plane. The position of the via determines the even mode impedance seen by the amplifying elements.

Pair 6 is also embodied as a pair of re-entrant type coupled lines 601, 602. The same holds for impedance inverter 8, which is also embodied as a pair of re-entrant type coupled lines 81, 82. Marchand balun 7 is configured in a manner similar to that shown in FIG. 7B.

Lines 401, 402, 501, 502, 601, 602, 81, 82, 701, 702, 703, 704 are all realized using re-entrant type coupled lines having a length corresponding to a quarter wavelength for odd mode signals at the fundamental frequency. Line 9 can be formed as a transmission line having a length corresponding to a quarter wavelength for signals at the fundamental frequency. For line 9 no distinction needs to be made between odd and even mode signals as only single-ended signals propagate in that line. In the FIG. 8 embodiment, the amplifying elements, or at least part thereof, are realized using one or more packaged devices which are arranged on a printed circuit board on which board also the various transmission line are realized.

Figure 10B:
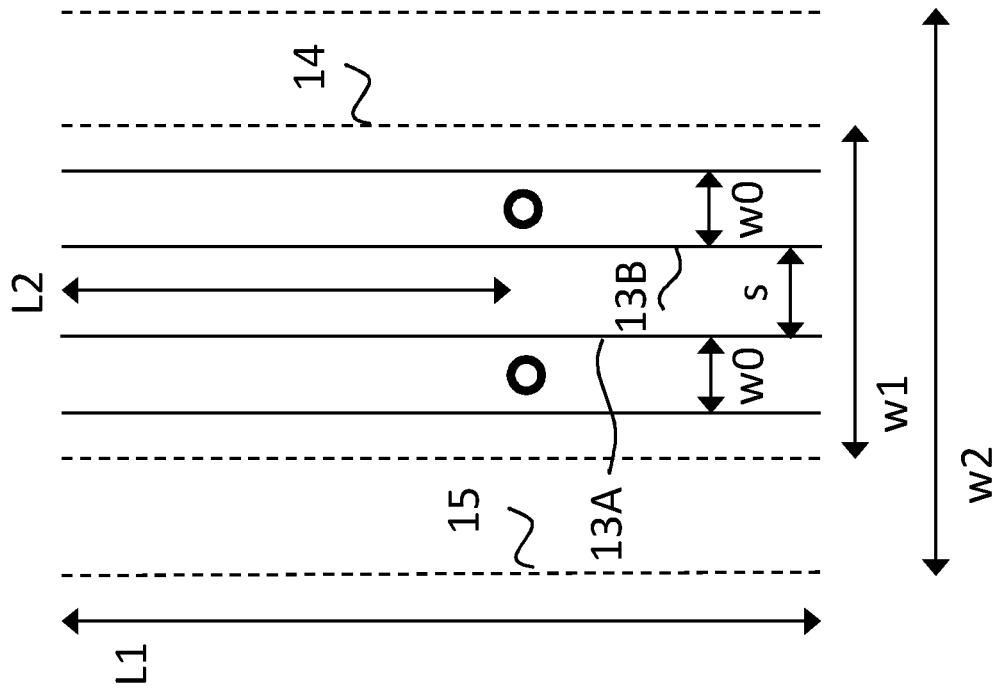
FIGS. 10A and 10B illustrate top views of the further embodiments of the impedance control unit shown in FIGS. 8A and 8B, respectively.
Figure 10A:
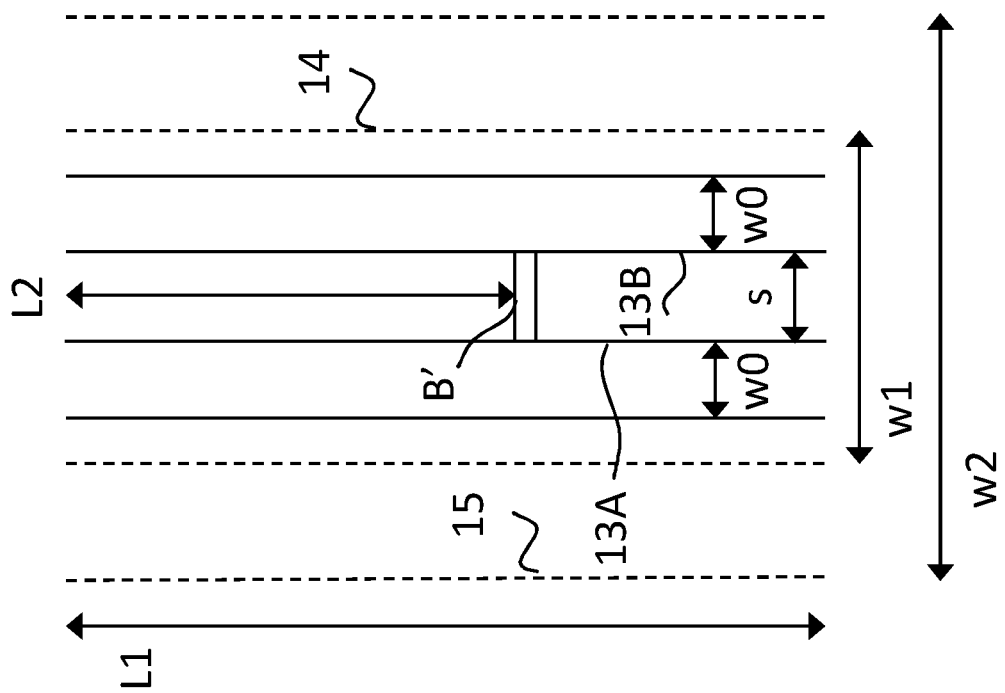

FIGS. 9A and 9B illustrate cross sectional views of further embodiments of an impedance control unit in accordance with the present invention that correspond to the coupled lines in FIGS. 2A and 2B, respectively, wherein an electrical connection is provided between the strips 13A, 13B. A corresponding top view is shown in FIGS. 10A and 10B, respectively. In these embodiments, an electrical short is realized between strips 13A and 13B, either directly using a conductive line 40, as shown in FIG. 8A, or indirectly using a via 41 between strips 13A, 13B and intermediate plane 14.

The electrical short between strips 13A, 13B will change the odd mode signal propagation, while the even mode signal propagation will not or hardly be affected by the electrical short. Similar to the embodiments in FIGS. 5 and 6, the electrical short is arranged locally. To realize a high odd mode impedance at one end of strips 13A, 13B, a length L2 between the end of strips 13A, 13B and the electrical short should correspond to a (2n−1) times a quarter wavelength for odd mode signal propagation at a desired frequency, e.g. the second harmonic frequency. At the same time, the total length L1 of strips 13A, 13B may correspond to a (2m−1) times a quarter wavelength for even mode signal propagation at a desired frequency, e.g. the fundamental frequency, to achieve a desired impedance inversion. The embodiments of FIGS. 6 and 8 may be combined into a single structure. Such a structure would then comprise a local electrical short between the intermediate plane and the ground plane and a local electrical short between the strips themselves. Such impedance control unit could for example be used for impedance matching purposes.

In the above, the present invention has been described using detailed embodiments thereof. It should be apparent that the invention is not limited to these embodiments but that various modifications are possible without deviating from the scope of the invention which is defined by the appended claims.

The invention claimed is:

1. An impedance control unit comprising:
a pair of re-entrant type coupled lines through which odd mode signals and even mode signals can propagate, the pair of re-entrant type coupled lines comprising:
a first conductive strip and a second conductive strip spaced apart from the first conductive strip, wherein the first and second conductive strips are electromagnetically coupled;
a conductive intermediate plane; and
a conductive ground plane;
an electrical connection between the conductive intermediate plane and the conductive ground plane, the electrical connection comprising a conductive via;
wherein the conductive intermediate plane laterally extends beyond the first and second conductive strips and wherein the electrical connection is configured to provide a radio frequency (RF) short or at least a small impedance for even mode signals propagating through the pair of re-entrant type coupled lines, and wherein the electrical connection is configured such that its arrangement does not significantly change the odd mode signals behavior of the pair of re-entrant type coupled lines.

2. The impedance control unit according to claim 1, wherein a size of the electrical connection along a signal propagation path inside the pair of re-entrant type coupled lines does not exceed a length that corresponds to an electrical length of 30 degrees at a frequency of interest within a range from 0.1 GHz 100 GHz.

3. The impedance control unit according to claim 1, wherein the electrical connection is positioned at (2n−1) times a quarter wavelength as computed from an end of the first conductive strip and/or second conductive strip, the quarter wavelength being based on an even mode phase velocity at a first predefined frequency, and n being a positive integer;
wherein the impedance control unit further comprises a first input port at a first end of the first conductive strip, and a first output port at a second end of the first conductive strip, wherein the impedance control unit comprises a second input port at a first end of the second conductive strip, and a second output port at a second end of the second conductive strip, and wherein the quarter wavelength is computed from the first end of the first conductive strip and/or the first end of the second conductive strip;
and wherein the first predefined frequency preferably lies within a range from 0.1 GHz-100 GHz.

4. The impedance control unit according to claim 1, wherein a length of the first and second conductive strips substantially equals (2p−1) times a quarter wavelength or 2p times a quarter wavelength, wherein the quarter wavelength is based on an odd mode propagation velocity at a second predefined frequency, and p being a positive integer, wherein the second predefined frequency preferably lies within a range from 0.1 GHz 100 GHz.

5. The impedance control unit according to claim 1, wherein the electrical connection is positioned in a lateral direction at a center of a gap between the first and second conductive strips.

6. The impedance control unit according to claim 1, wherein the pair of re-entrant type coupled lines further comprises:
a dielectric substrate comprising a first dielectric layer and a second dielectric layer, the first and second dielectric layers each having a first and second side, wherein the second side of the first dielectric layer is facing the first side of the second dielectric layer;
wherein the conductive ground plane is arranged on the second side of the second dielectric layer, and wherein the first and second conductive strips are arranged on the first or second side of the first dielectric layer and wherein the conductive intermediate plane is arranged on the second or first side of the first dielectric layer, respectively;
wherein a dielectric constant of the first dielectric layer is substantially greater than a dielectric constant of the second dielectric layer and/or wherein a thickness of the first dielectric layer is substantially less than a thickness of the second dielectric layer;
wherein the conductive ground plane extends in a lateral direction beyond the conductive intermediate plane; and
wherein the conductive via extends through the second dielectric layer.

7. The impedance control unit according to claim 6, wherein the conductive via comprises a conductive through via that extends through both the first and second dielectric layers.

8. The impedance control unit according to claim 7, wherein the first and second conductive strips each curve around the conductive through via.

9. The impedance control unit according to claim 6, wherein the conductive intermediate plane is arranged in between the first and second dielectric layers and wherein the first and second conductive strips are arranged on the first side of the first dielectric layer or wherein the first and second conductive strips are arranged in between the first and second dielectric layers and wherein the conductive intermediate plane is arranged on the first side of the first dielectric layer.

10. The impedance control unit according to claim 1, wherein the impedance control unit further comprises an electrical connection between the first and second conductive strips that is arranged inside a space that is occupied by the pair of coupled lines, wherein the electrical connection between the first and second conductive strips is positioned at (2m−1) times a quarter wavelength as computed from an end of the first conductive strip and/or second conductive strip, the quarter wavelength being based on an odd mode propagation velocity at a third predefined frequency, and m being a positive integer and/or wherein the electrical connection between the first and second conductive strips comprises a conductive line that extends between the first and second conductive strips or wherein the electrical connection between the first and second conductive strips comprises a first conductive via that extends between the first conductive strip and the conductive intermediate plane and a second conductive via that extends between the second conductive strip and the conductive intermediate plane.

11. The impedance control unit according to claim 3, wherein the impedance control unit is comprised in an electrical device configured to operate at an operational frequency, wherein the first predefined frequency corresponds to 2i times the operational frequency, with i being a positive integer.

12. The impedance control unit according to claim 11, wherein the electrical device comprises a pair of amplifying elements that are operated in a push-pull configuration, wherein an output of a first amplifying element is coupled to the first conductive strip of the impedance control unit and wherein an output of a second amplifying element is coupled to the second conductive strip of the impedance control unit.

13. The impedance control unit according to claim 10, wherein the impedance control unit is comprised in an electrical device, and wherein the third predefined frequency corresponds to 2j−1 times the operational frequency, with j being a positive integer.

14. The impedance control unit according to claim 13, wherein the electrical device comprises a pair of amplifying elements that are operated in a push-pull configuration, wherein an output of a first amplifying element is coupled to the first conductive strip of the impedance control unit and wherein an output of a second amplifying element is coupled to the second conductive strip of the impedance control unit.

15. A balun unit, comprising:
  a balun having a first balanced port, a second balanced port, and an unbalanced port; and
  an impedance control unit comprising:
    a pair of re-entrant type coupled lines through which odd mode signals and even mode signals can propagate, the pair of re-entrant type coupled lines comprising:
      a first conductive strip and a second conductive strip spaced apart from the first conductive strip, wherein the first and second conductive strips are electromagnetically coupled;
      a conductive intermediate plane; and
      a conductive ground plane;
    an electrical connection between the conductive intermediate plane and the conductive ground plane, the electrical connection comprising a conductive via;
    wherein the conductive intermediate plane laterally extends beyond the first and second conductive strips and wherein the electrical connection is configured to provide a radio frequency (RF) short or at least a small impedance for even mode signals propagating through the pair of re-entrant type coupled lines, and wherein the electrical connection is configured such that its arrangement does not significantly change the odd mode signals behavior of the pair of re-entrant type coupled lines;
    wherein the first conductive strip is connected to the first balanced port and wherein the second conductive strip is connected to the second balanced port.

16. The balun unit according to claim 15, wherein the balun and the impedance control unit are arranged on a same substrate, wherein the balun comprises a plurality of the re-entrant type coupled lines, wherein the conductive ground planes of the plurality of re-entrant coupled lines and the conductive ground plane of the impedance control unit are formed by a single conductive ground plane, the balun comprising a Marchand balun that comprises a compensation line for compensating a difference in propagation velocities for an even mode and an odd mode.

17. The balun unit according to claim 15, wherein the electrical connection is positioned at (2n−1) times a quarter wavelength as computed from an end of the first conductive strip and/or second conductive strip, the quarter wavelength being based on an even mode phase velocity at a first predefined frequency, and n being a positive integer;
  wherein the impedance control unit comprises a first input port at a first end of the first conductive strip, and a first output port at a second end of the first conductive strip, wherein the impedance control unit comprises a second input port at a first end of the second conductive strip, and a second output port at a second end of the second conductive strip, and wherein the quarter wavelength is computed from the first end of the first conductive strip and/or the first end of the second conductive strip;
  and wherein the first predefined frequency preferably lies within a range from 0.1 GHz-100 GHz;
  and wherein the balun unit is comprised in an electrical device configured to operate at an operational frequency, wherein the first predefined frequency corresponds to 2i times the operational frequency, with i being a positive integer.

18. The balun unit according to claim 17, wherein the electrical device comprises a pair of amplifying elements that are operated in a push-pull configuration, wherein an output of a first amplifying element is coupled to the first conductive strip of the impedance control unit and wherein an output of a second amplifying element is coupled to the second conductive strip of the impedance control unit.

19. The balun unit according to claim 15, wherein the impedance control unit further comprises an electrical connection between the first and second conductive strips that is arranged inside a space that is occupied by the pair of coupled lines, wherein the electrical connection between the first and second conductive strips is positioned at (2m−1) times a quarter wavelength as computed from an end of the first conductive strip and/or second conductive strip, the quarter wavelength being based on an odd mode propagation velocity at a third predefined frequency, and m being a positive integer and/or wherein the electrical connection between the first and second conductive strips comprises a conductive line that extends between the first and second conductive strips or wherein the electrical connection between the first and second conductive strips comprises a first conductive via that extends between the first conductive strip and the conductive intermediate plane and a second conductive via that extends between the second conductive strip and the conductive intermediate plane;

and wherein the balun unit is comprised in an electrical device, and wherein the third predefined frequency corresponds to 2j−1 times the operational frequency, with j being a positive integer.

20. The balun unit according to claim 19, wherein the electrical device comprises a pair of amplifying elements that are operated in a push-pull configuration, wherein an output of a first amplifying element is coupled to the first conductive strip of the impedance control unit and wherein an output of a second amplifying element is coupled to the second conductive strip of the impedance control unit.

21. A Doherty amplifier, comprising:
a pair of main amplifying elements balun unit that are operated in a push-pull configuration;
a pair of peak amplifying elements that are operated in a push-pull configuration;
a splitter for splitting an RF input signal and for feeding the split RF input signal to the pairs of main and peak amplifying elements;
a Doherty combiner configured for combining signals from a first main amplifying element and a first peak amplifying element, and for combining signals from a second main amplifying element and a second peak amplifying element; and
a balun having a first balanced input port configured for receiving the combined signals from the first main amplifying element and the first peak amplifying element, a second balanced input port configured for receiving the combined signals from the second main amplifying element and the second peak amplifying element, and an output port;
wherein the Doherty combiner comprises an impedance control unit comprising:
a pair of re-entrant type coupled lines through which odd mode signals and even mode signals can propagate, the pair of re-entrant type coupled lines comprising:
a first conductive strip and a second conductive strip spaced apart from the first conductive strip, wherein the first and second conductive strips are electromagnetically coupled;
a conductive intermediate plane; and
a conductive ground plane;
an electrical connection between the conductive intermediate plane and the conductive ground plane, the electrical connection comprising a conductive via;
wherein the conductive intermediate plane laterally extends beyond the first and second conductive strips and wherein the electrical connection is configured to provide a radio frequency (RF) short or at least a small impedance for even mode signals propagating through the pair of re-entrant type coupled lines, and wherein the electrical connection is configured such that its arrangement does not significantly change the odd mode signals behavior of the pair of re-entrant type coupled lines;
and wherein one or more of the pairs of amplifying elements is/are configured to operate in class E or inverse class F.

* * * * *